United States Patent [19]

Shinozaki et al.

[11] Patent Number: 5,002,850

[45] Date of Patent: Mar. 26, 1991

[54] PHOTOSENSITIVE MATERIAL WITH ALKALI-IN SOLUBLE BARRIER LAYER

[75] Inventors: Fumiaki Shinozaki; Kazuo Suzuki; Tamotsu Suzuki; Tomizo Namiki; Tomohisa Tago; Mikio Totsuka, all of Shizuoka, Japan

[73] Assignee: Fuji Photo Film Co., Ltd., Kanagawa, Japan

[21] Appl. No.: 393,103

[22] Filed: Aug. 3, 1989

Related U.S. Application Data

[63] Continuation of Ser. No. 64,477, Jun. 22, 1987, abandoned.

[30] Foreign Application Priority Data

Jun. 23, 1986 [JP] Japan .................................. 61-146581

[51] Int. Cl.$^5$ ..................... G03F 7/105; G03F 7/023; G03C 1/60; G03C 1/93
[52] U.S. Cl. ................................... 430/166; 430/143; 430/167; 430/271; 430/257; 430/259; 430/262; 430/293
[58] Field of Search .............. 430/166, 167, 271, 143, 430/293, 257, 259, 262

[56] References Cited

U.S. PATENT DOCUMENTS

| | | | |
|---|---|---|---|
| 3,671,236 | 6/1972 | Van Beusekom | 430/143 |
| 3,721,557 | 3/1973 | Inoue | 430/166 |
| 3,775,113 | 11/1973 | Bonham et al. | 430/293 |
| 4,260,673 | 4/1981 | Krech | 430/166 |
| 4,268,601 | 5/1981 | Namiki et al. | 430/166 |
| 4,307,172 | 12/1981 | Ishihara et al. | 430/166 |
| 4,482,625 | 11/1984 | Namiki et al. | 430/143 |
| 4,599,295 | 7/1986 | Kondo et al. | 430/143 |
| 4,656,114 | 4/1987 | Cederburg et al. | 430/143 |
| 4,666,817 | 5/1987 | Sachi | 430/143 |
| 4,748,101 | 5/1988 | Barton | 430/166 |

*Primary Examiner*—Charles L. Bowers, Jr.
*Attorney, Agent, or Firm*—Sughrue, Mion, Zinn, Macpeak & Seas

[57] ABSTRACT

A photosensitive material comprises:
(I) an undercoat layer containing at least one alcohol-soluble polyamide;
(II) an alcohol-insoluble barrier layer; and
(III) a coloring material-containing photosensitive layer or a laminate of a coloring material layer and a photosensitive layer superposed in order on a support to form a laminate.

5 Claims, No Drawings

PHOTOSENSITIVE MATERIAL WITH ALKALI-INSOLUBLE BARRIER LAYER

This is a continuation of application Ser. No. 07/064,477 filed June 22, 1987, abandoned.

BACKGROUND OF THE INVENTION

1. Field of the Invention

The present invention relates to a photosensitive material advantageously employable for color proof in color proofing or display.

2. Description of Prior Art

There are known image transfer processes comprising imagewise exposing a photosensitive transfer material comprising an undercoat layer composed of an organic polymer, a coloring material layer and a photosensitive layer provided on a temporary support to light, developing it to form a color image on a peel layer and transferring the image to a given support (permanent support) using an adhesive (see, Japanese Patent Publication Nos. 46(1971)-15326 and 49(1974)-441). These processes have advantages in that they can be used as color proof for various procedures such as overlay type proof and surprint type proof. However, these processes have disadvantages in that an adhesive must be used for every transferring procedure and hence the processes are complicated and in that there is a difficulty in keeping the accuracy of registration in transferring each color.

To eliminate the complicated procedures of the process, there are proposed methods wherein after the formation of an image, the image is transferred to a permanent support under the application of heat and pressure (see, Japanese Patent Provisional Publication Nos. 47(1972)-41830, 48(1973)-9337 and 51(1976)-5101). Particularly, Japanese Patent Provisional Publication No. 51(1976)-5101 discloses that a hot-melt polymer layer as an adhesive is provided on a permanent support and Japanese Patent Provisional Publication No. 47(1972)-41830 proposes that an image is transferred directly to a permanent support such as art paper or coated paper.

However, these processes have still various disadvantages in that the final image is transferred to a permanent support in such a manner that the right and the left are reversed against the original image and in that when a hot-melt polymer is used as an adhesive, the melting point thereof is usually high and hence the transferring temperature must be high so that the dimensional stability of the support is deteriorated by the action of heat, and the deviation of colors from one another in registration is caused in transferring each color. When a hot-melt polymer having a low melting point is used as an adhesive, there are caused problems that after the formation of an image, sticking is observed, or the surface thereof is liable to be marred.

As a method for eliminating the above-described disadvantages, there is proposed in Japanese Patent Provisional Publication No. 59(1984)-97140 a process wherein an image is transferred to a temporary image receiving sheet before the image is transferred to a permanent support. This process includes steps of: preparing a temporary image receiving sheet provided with an image receiving layer composed of a photopolymerizable material on a support; transferring an image of each color to the temporary image receiving sheet before the image of each color is transferred to a permanent support; re-transferring said image to a permanent support; and exposing wholly it to light to cure the transferred photopolymerizable image receiving layer.

The above-described image transferring process using the temporary image receiving sheet (hereinafter referred to simply as image receiving sheet) is very effective in eliminating the aforementioned problems. In more detail, there are given the following advantages. An erect image against the masked original can be obtained on the permanent support. Since an ethylenically unsaturated polyfunctional monomer serving as a photopolymerizable substance is incorporated in the photopolymerizable image receiving layer of the image receiving sheet, the photopolymerizable image receiving layer itself is soft, transferring can be carried out at a low temperature and after transferring, it can be exposed wholly to light to cure it. Thus, there are given advantages that after the transfer of the image, sticking is not observed and the final image has high resistance to marring.

As the photosensitive transfer material used in the image transferring method, there is generally used a photosensitive material comprising an undercoat layer (functioning as a peel layer) composed of an organic polymer, and a coloring material-containing photosensitive layer (or a laminate composed of a coloring material layer and a photosensitive layer) in order in the form of a laminate.

There have been proposed various materials as undercoat layer-forming materials for the photosensitive material. Among them, high-molecular polymer materials mainly composed of an alcohol-soluble polyamide are preferred from the viewpoints of such characteristics that they have proper adhesion to the temporary support, but can be peeled therefrom, and while they are non-tacky at room temperature, they become tacky or fusable by heating.

Though the high-molecular polymer materials mainly composed of an alcohol-soluble polyamide are excellent materials for the formation of a peel layer from the viewpoints of the above-described functions, the present inventors have found that there are caused problems in the course of the production of the photosensitive material, because they are soluble in alcohols.

In the formation of a coloring material-containing photosensitive layer or a coloring material layer on the peel layer, there are often used coating solutions containing an alcohol such as methanol, ethanol or propanol as a solvent. Hence, there is often caused that during coating procedure, a part of the surface of the peel layer is dissolved and a part of a coloring material is introduced into the peel layer. In such a case, color fogging is caused by the coloring material introduced into the peel layer and the quality of the obtained image deteriorates.

Further, the use of pigments, not dyes, as the coloring material is effective in preventing color fogging from being caused in the non-image part. In the case where naphthoquinone diazide compounds are used as photosensitive materials, the foot of the absorption spectrum of said compounds extends to reach the visible light region so that when the compounds are introduced into the peel layer, color fogging is caused and the quality of the image lowers.

SUMMARY OF THE INVENTION

It is an object of the present invention to provide a photosensitive material which is effective in obtaining an image of good quality.

It is other object of the present invention to provide a photosensitive material particularly suitable for use as a photosensitive transfer material which is effective in obtaining the final image of good quality.

The present invention provides a photosensitive material comprising:

(I) an undercoat layer containing at least one alcohol-soluble polyamide;

(II) an alcohol-insoluble barrier layer; and (III) a coloring material-containing photosensitive layer or a laminate comprising a coloring material layer and a photosensitive layer;

superposed in order on a support to form a laminate.

The photosensitive material of the invention is particularly suitable for use as a photosensitive transfer material for use in an image forming process comprising forming a transferable image on a photosensitive material, transferring said image to an image receiving sheet and re-transferring said image to a permanent support.

However, the photosensitive material of the invention may be used as a photosensitive transfer material for use in the conventional image forming processes using no image receiving sheet. Further, the photosensitive material can be used in a process wherein an image is formed directly on a photosensitive material without performing the transferring steps, because an image formed on the photosensitive material of the present invention scarcely suffers from color fogging.

DETAILED DESCRIPTION OF THE INVENTION

The present invention will be described in more detail hereinafter.

Materials for the support (or temporary support) which can be used for the photosensitive material of the invention, can be chosen from among those described in the aforementioned patent publications. Examples of the materials for the support include polyethylene terephthalate, polypropylene, polyethylene, polyvinyl chloride, polystyrene, polycarbonate and triacetate. As the temporary support, there is preferred a biaxially oriented polyethylene terephthalate film, because of its excellent strength, heat resistance, dimensional stability, transparency, etc. Though there are no limitations in regard of the thickness of the support, a thickness in the range of 50 to 150 μm is preferred.

There is known the undercoat layer containing an alcohol-soluble polyamide to be provided on the support. The undercoat layer functions as a peel layer (i.e., peelable layer), when an image is to be transferred to other sheet. For example, the undercoat layer containing an alcohol-soluble polyamide, is described in Japanese Patent Provisional Publication No. 61(1986)-188537.

As the alcohol-soluble polyamide, there can be advantageously used linear polyamides synthesized from a dibasic fatty acid and an amine such as a diamine, amino acid, a lactam or a derivative thereof. The linear polyamides may be any of homopolymers, random copolymers and block copolymers. There may be used polyamides having a substituent or substituents attached to carbon or nitrogen atoms in the principal chain and polyamides having other linkages in addition to C—C linkages and C-N-C linkages in the main chain.

Typical examples of the alcohol-soluble polyamides include linear homopolyamides such as nylons 3, 4, 5, 6, 8, 11, 12, 13, 66, 610 and 1313, a polymer of m-xylylene diamine and adipic acid, a polymer of trimethylhexamethylenediamine and terephthalic acid and a polymer of 1,4-diaminomethylcyclohexane and suberic acid; interpolyamides such as types of 6/66/610, 6/66/610/612 and 6/66/12 and ϵ-caprolactam/adipic acid/hexamethylenediamine/4,4′-diaminodicyclohexylmethane copolyamide; and polyamide derivatives such as N-methylol-substituted polyamide, N-alkoxyalkyl-substituted polyamides and N-aryloxy-alkyl-substituted polyamides.

The undercoate layer may contain other high-molecular polymer or additives in addition to the alcohol-soluble polyamide. However, it is desirable that the undercoat layer contains at least 50% by weight of the alcohol-soluble polyamide in order to allow the undercoat layer to function as a peel layer.

Preferably, the undercoat layer containing the alcohol-soluble polyamide to be provided on the support has a thickness in the range of 0.2 to 10 μm.

On the undercoat layer, an alcohol-insoluble barrier layer is superposed.

Any of conventional materials may be used as materials for the alcohol-insoluble barrier layer, so long as they are insoluble in alcohols. Examples of the materials which can be used for the alcohol-insoluble barrier layer include polyacrylates, acrylate copolymers, polymethacrylates, methacrylate copolymers, polyacrylamide, acrylamide copolymers, polyvinyl chloride, vinyl chloride copolymers, polyvinylidene chloride, vinylidene chloride copolymers, polystyrene, styrene copolymers, ethylene copolymers (e.g., ethylene-vinyl acetate copolymer, ethylene-acrylate copolymer, ethylene-vinyl chloride copolymer and ethylene-acrylic acid copolymer), polyvinyl acetals (e.g., polyvinyl formal), polyester resins, cellulosic resins, rubber (e.g., synthetic rubber and chlorinated rubber) and polyolefins (e.g., polyethylene and polypropylene).

These materials may be used either alone or as a mixture of two or more of them. The barrier layer may be composed of two or more layers. If desired, the barrier layer may contain additives such as a tackifier, a plasticizer, etc.

The barrier layer can be formed on the undercoat layer, for example, by preparing a coating solution of the above-mentioned polymer in a solvent described below, and then coating the surface of the undercoating layer with the coating solution and drying it. Examples of the solvents which can be used for the preparation of the coating solution include hydrocarbon solvents (e.g., toluene, xylene, cyclohexane, etc.), halogenated hydrocarbon solvents (e.g., methyl chloride, dichloromethane, 1,2-di-chloroethane, etc.), ketone solvents (e.g., acetone, methyl ethyl ketone, etc.), and ester solvents (e.g., methyl acetate, ethyl acetate, propyl acetate, etc.).

Preferably, the thickness of the barrier layer is in the range of 0.2 to 10 μm.

The coloring material layer to be provided on the barrier layer will be described hereinbelow. The coloring material layer is basically a layer comprising a coloring material such as pigment or dye dispersed in an organic high-molecular material (i.e., binder).

The coloring materials which can be used in the present invention are described in the aforementioned patent publications. Appropriate coloring material can be chosen from those described in these publications. Examples of the coloring materials include pigments and dyes described in Japanese Patent Provisional Publication No. 47(1972)-16124, No. 52(1977)-89916, No. 55(1980)-117142, and No. 55(1980)-127552, U.S. Pat. No. 4,472,494 and Color Index. Particularly, when the transfer material is to be used as color proof for print, pigments are preferred to allow color reproducibility to agree with the desired print.

Organic high-molecular polymers which can be used to disperse or dissolve the coloring material therein, are disclosed in the aforementioned patent publications. An appropriate polymer can be chosen from those described therein. Particularly, alkali-soluble organic high-molecular polymers are preferred, because the coloring material layer and the photosensitive layer containing naphthoquinone diazide photosensitive material can be developed in a single bath.

Examples of the alkali-soluble organic high-molecular polymers include those described in U.S. Pat. No. 2,893,368 (polymers containing salt-forming group), U.S. Pat. No. 2,927,022 (cellulose polymers containing acid group), German Patent Provisional Publication (OLS) No. 2,123,702 (copolymers such as methyl methacrylate/methacrylic acid copolymer), OLS No. 2,205,146 (acid containing polymers such as styrene/-mono-n-butyl maleate copolymer or vinyl acetate/crotonic acid copolymer), OLS No. 2,320,849 (vinyl addition polymer containing free carboxyl groups such as copolymer of acrylic acid with one or more alkyl acrylates) and Japanese Patent Publication No. 59(1984)-44615 (copolymers such as methacrylic acid-/aralkyl methacrylate copolymer). Further, there can be used organic high-molecular polymers (binder), phenolic resins, rosin and polyhydroxystyrene described in Japanese Patent Provisional Publication No. 47(1972)-16124, No. 52(1977)-89916, No. 55(1980)-117142, No. 55(1980)-127552 and U.S. Pat. No. 4,472,494.

If desired, additives such as a plasticizer, pigment dispersion stabilizer, surfactant, etc. may be incorporated into the coloring material layer.

The content of the coloring material in the coloring material layer varies depending on the purpose, but is preferably in the range of 5 to 50% by weight.

The photosensitive layer to be provided on the coloring material layer will be described hereinbelow.

The photosensitive layer of the photosensitive transfer material of the invention preferably is a layer containing the photosensitive esterification product of naphthoquinone diazide in a high-molecular polymer (i.e., binder).

A great number of esterification products of naphthoquinone diazide which can be used as a photosensitive material in the photosensitive transfer material, are known. Examples of the photosensitive esterification products of naphthoquinone diazide include compounds described in Japanese Patent Publication No. 36(1961)-22062, No. 37(1962)-1953, No. 37(1962)-3627, No. 37(1962)-13109, No. 37(1962)-15665, No. 38(1963)-18015, No. 38(1963)-12083, No. 40(1965)-21093, No. 40(1965)-26126, No. 45(1970)-27345, No. 40(1965)-3801, No. 44(1969)-18445, No. 45(1970)-5604 and No. 51(1976)-13013.

The photosensitive material to be incorporated into the photosensitive layer may be other compound than the photosensitive esterification product of naphthoquinone diazide. Typical examples of such compounds include photopolymerizable compounds and photo-crosslinkable compounds.

Examples of the photopolymerizable compounds include monomer compounds having a boiling point of 150° C. or higher under atmospheric pressure and capable of forming a polymer through addition polymerization. Examples of such monomer compounds include polyfunctional vinyl monomers or vinylidene compounds.

Unsaturated esters of polyols, particularly acrylates and methacrylates of polyols are preferred as vinyl monomers or vinylidene compounds. Examples of such compounds include ethylene glycol diacrylate, glycerol triacrylate, polyacrylates, ethylene glycol dimethacrylate, 1,3-propanediol dimethacrylate, polyethylene glycol dimethacrylate, 1,2,4-butanetriol trimethacrylate, trimethylolethane triacrylate, pentaerythritol dimethacrylate, pentaerythritol trimethacrylate, pentaerythritol tetramethacrylate, pentaerythritol diacrylate, pentaerythritol triacrylate, pentaerythritol tetraacrylate, dipentaerythritol polyacrylate, 1,3-propanediol diacrylate, 1,5-pentanediol dimethacrylate, bisacrylate or bismethacrylate of polyethylene glycol having a molecular weight of 200 to 400 and analogues thereof.

Unsaturated amides can also be used as the monomer compound. Examples thereof include unsaturated amides of acrylic acid and methacrylic acid containing α-diamine and ethylenebismethacrylamide. The alkylene chain of the unsaturated amide may be opened at carbon atom. The photopolymerizable monomers are not limited to the compounds described above, but other compounds may be used.

The above-described photopolymerizable compounds are usually used together with a photopolymerization initiator which is activated by actinic rays. Optionally, a heat polymerization inhibitor is added.

Examples of the photopolymerization initiators include aromatic ketones such as benzophenone, Michler's ketone [4,4'-bis(dimethylamino)benzophenone], 4-methoxy-4'-dimethylaminobenzophenone, 2-ethylanthraquinone, phenanthraquinone and the like; benzoin and benzoin ethers such as benzoin methyl ether, benzoin ethyl ether and benzoin phenyl ether; benzoins such as methylbenzoin and ethylbenzoin; and imidazole such as 2-(o-chlorophenyl)-4,5-diphenylimidazole dimer, 2-(o-chlorophenyl)-4,5-(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer and 2,4,5-triacrylimidazole dimer which is stated in U.S. Pat. Nos. 3,479,185 and 3,784,557 and U.K. Patent No. 1,047,569.

Examples of the heat polymerization inhibitor include p-methoxyphenol, hydroquinone, alkyl- or aryl-substituted hydroquinones, t-butyl catechol, pyrogallol, naphthylamine, β-naphthol, phenathiazine, pyridine, nitrobenzene, o-toluquinone and aryl phosphites. However, the inhibitors are not limited thereto, but other compounds may be used.

Typical example of the photo-crosslinkable compounds includes polyvinyl cinnamate derived from polyvinyl alcohol. Other examples of the photo-crosslinkable compounds include compounds having azide group as a photosensitive group. Examples of binders which may be used in combination with the compound having azide group include polyacrylamide, polyacrylonitrile, alcohol-soluble nylons, rubber, styrene-budadiene copolymer and phenolic resins.

It is desirable that the high-molecular polymers functioning as a binder are soluble in alkaline solutions. As such polymers, novolak resins are frequently used. Examples of the novolak resins include those described in U.S. Pat. Nos. 3,184,310 and 3,535,157, Japanese Patent Publications Nos. 50(1975)-7482, 50(1975)-8658, 51(1976)-14042 and Japanese Patent Provisional Publication No. 49(1974)-48403. Mixtures of the novolak resin with other high-molecular compound can be used. Examples of the mixtures include those described in U.S. Pat. No. 3,535,157, French Patent No. 1,542,334 and Japanese Patent Publications Nos. 41(1966)-16259, 44(1969)-24323 and 49(1974)-36961.

The photosensitive material such as the photosensitive esterification product of naphthoquinone diazide used in the photosensitive layer is used in a ratio of the photosensitive material to the binder of preferably 0.10/1 to 0.5/1 by weight.

Preferably, the thickness of the photosensitive layer is from 0.1 to 10 $\mu$m.

The coloring material layer and the photosensitive layer may be combined together to form a single coloring material-containing photosensitive layer. The structure of and material for the coloring material-containing photosensitive layer are known. The coloring material-containing photosensitive layer can be formed by referring to known techniques.

The photosensitive material of the present invention can be used in performing known image forming processes. Particularly, the photosensitive material of the present inventon can be more effectively utilized, when it is used in combination with an image receiving sheet in which a peel layer is interposed between a suport and a photopolymerizable image receiving layer. With regard to the image receiving sheet, a U.S. patent application Ser. No. 07/064,476 now abandoned, entitled "photosensitive image receiving sheet material" has been filed as of the same date as the present application. The image receiving sheet is described in more detail in the specification of the co-pending patent application.

The following examples are provided to illustrate the present invention without limiting it thereto.

EXAMPLE 1

Preparation of Photosensitive Transfer Material

A solution having the following composition was prepared as a coating solution for the formation of an undercoat layer.

| | |
|---|---|
| Alcohol-soluble polyamide (CM-8000, manufactured by Toray Industries, Inc., [$\eta$] = 23 cps at 20° C., 10 wt. % methanol solution) | 7.2 g |
| Polyhydroxystyrene (average molecular weight: 5,500, Resin M, manufactured by Maruzen Oil Co., Ltd.) | 1.8 g |
| Methanol | 400 g |
| Methyl cellosolve | 100 g |

The coating solution was uniformly coated on a surface of a polyethylene terephthalate film (temporary support) of 100 $\mu$m in thickness, and dried to form an undercoat layer having thickness (dry basis) of 0.5 $\mu$m.

A solution having the following composition was prepared as a coating solution for the formation of a barrier layer.

| | |
|---|---|
| Polymethyl methacrylate (average molecular weight: 100,000) | 3 g |
| Methyl ethyl ketone | 80 g |
| Methyl cellosolve acetate | 20 g |

The coating solution was uniformly coated on the surface of the undercoat layer and dried to form a barrier layer having dry thickness of 0.5 $\mu$m.

Each of the following mother liquors I and II for pigment dispersion was prepared for the formation of a coloring material layer.

| Mother liquor I | |
|---|---|
| Styrene-maleic acid copolymer resin (Oxylac SH-101, manufactured by Japan Catalytic Chemical Industry Co., Ltd.) | 20 g |
| n-Propanol | 80 g |
| Mother liquor II | |
| Methoxymethylated nylon (Toresin MF-30, manufactured by Teikoku Kagaku Co., Ltd.) | 10 g |
| Methanol | 90 g |

A pigment dispersion having the following composition for each of four colors was prepared using the mother liquors I and II.

| Coating solution for yellow coloring material layer | |
|---|---|
| Mother liquor I | 95 g |
| Mother liquor II | 30 g |
| n-Propanol | 28 g |
| Acetone | 20 g |
| Seika Fast Yellow H-0755 (manufactured by Dainichiseika Color Chemical Mfg. Co., Ltd.) | 12.2 g |
| Coating solution for magenta coloring material layer | |
| Mother liquor I | 95 g |
| Mother liquor II | 30 g |
| n-Propanol | 28 g |
| Acetone | 20 g |
| Seika Fast Carmine 1483 (manufactured by Dainichiseika Color & Chemicals Mfg. Co., Ltd.) | 12.2 g |
| Coating solution for cyan coloring material layer | |
| Mother liquor I | 95 g |
| Mother liquor II | 30 g |
| n-Propanol | 28 g |
| Acetone | 20 g |
| Cyanine Blue 4920 (manufactured by Dainichiseika Color & Chemicals Mfg. Co., Ltd.) | 12.2 g |
| Coating solution for black coloring material layer | |
| Mother liquor I | 95 g |
| Mother liquor II | 30 g |
| n-Propanol | 28 g |
| Acetone | 20 g |
| Mitsubishi Carbon Black MA-100 (manufactured by Mitsubishi Chemical Industries, Ltd.) | 12.2 g |

The preparation of the dispersion was conducted for 6 hours by using a test dispersion mixer (paint shaker, manufactured by Toyo Seiki Co., Ltd.).

A diluent having the following composition for the pigment dispersion was prepared.

| | |
|---|---|
| Methyl ethyl ketone | 40 g |

| | |
|---|---|
| Acetone | 28 g |
| Fluorine-containing surfactant (Flolard FC-430, manufactured by Sumitomo 3M Co., Ltd.). | 0.2 g |

The pigment dispersion of each of the four colors was diluted with the diluent in a weight ratio described below, and the diluted dispersion was stirred for 10 minutes and subjected to an ultrasonic dispersion treatment for 10 minutes to obtain a coating solution for the coloring material layer.

The coating solution was filtered through a filter (Toyo Filter Paper No. 63 Filter), applied to the temporary support provided with the undercoat layer and the barrier layer by means of a whirler and dried at 100° C. for 2 minutes to form a coloring material layer for each of the four colors.

| | |
|---|---|
| Yellow layer | |
| Optical density (blue filter) | 0.50 |
| Magenta layer | |
| Optical density (green filter) | 0.75 |
| Cyan layer | |
| Optical density (red filter) | 0.65 |
| Black layer | |
| Optical filter (no filter) | 0.90 |

A photosensitive solution having the following composition was filtered through the No. 63 Filter, applied to the coloring material layer of each of the four colors by use of a whirler and dried at 100° C. for 2 min. to form a photosensitive layer having dry thickness of 1.0 μm.

| | |
|---|---|
| Adduct of 2-diazo-1-naphthol-4-sulfonyl chloride to condensate (average degree of polymerization:3) between acetone and pyrogallol | 15 g |
| Novolak type phenol-formaldehyde resin (PR-50716, manufactured by Sumitomo Dures Co., Ltd.) | 30 g |
| Tricresyl phosphate | 5 g |
| n-Propyl acetate | 280 g |
| Cyclohexanone | 120 g |

Thus, there was prepared a colored photosensitive sheet (i.e., photosensitive transfer material) for each of the four colors, each sheet comprising the undercoat layer containing an alcohol-soluble polyamide, the alcohol-insoluble barrier layer, the coloring material layer and the photosensitive layer superposed in order on the support to form a laminate.

EXAMPLE 2

Preparation of Photosensitive Transfer Material

The procedure of Example 1 was repeated except that a coating solution having the following composition was used for the formation of the barrier layer. There was prepared a colored photosensitive sheet (photosensitive transfer sheet) for each of the four colors, each sheet comprising an undercoat layer containing an alcohol-soluble polyamide, an alcohol-insoluble barrier layer, a coloring material layer and a photosensitive layer arranged in order on a support to form a laminate.

| | |
|---|---|
| Polyvinyl chloride (average degree of polymerization: 850, tradename: Geon 25, straight polyvinyl chloride, manufactured by Nippon Geon Co., Ltd.) | 2 g |
| Methyl ethyl ketone | 80 g |
| Cyclohexanone | 20 g |

EXAMPLE 3

Preparation of Photosensitive Transfer Material

The procedure of Example 1 was repeated except that a coating solution having the following composition was used for the formation of the barrier layer. There was prepared a colored photosensitive sheet (photosensitive transfer sheet) for each of the four colors, each sheet comprising an undercoat layer containing an alcohol-soluble polyamide, an alcohol-insoluble barrier layer, a coloring material layer and a photosensitive layer arranged in order on a support to form a laminate.

| | |
|---|---|
| Cellulose diacetate (degree of acetylation: 55%, average degree of polymerization: 150) | 3 g |
| Acetone | 50 g |
| Methyl ethyl ketone | 40 g |
| Cyclohexanone | 10 g |

COMPARISON EXAMPLE 1

Preparation of Photosensitive Transfer Material

The procedure of Example 1 was repeated except that the barrier layer was omitted. There was prepared a colored photosensitive sheet (photosensitive transfer material) for each of the four colors, each sheet comprising an undercoat layer containing an alcohol-soluble polyamide, a coloring material and a photo-sensitive layer arranged in order on a support to form a laminate.

COMPARISON EXAMPLE 2

Preparation of Photosensitive Transfer Material

The procedure of Example 1 was repeated except that the undercoat layer was omitted. There was prepared a colored photosensitive sheet (photosensitive transfer sheet) for each of the four colors, each sheet comprising a barrier layer, a coloring material layer and a photosensitive layer arranged in order on a support to form a laminate.

COMPARISON EXAMPLE 3

Preparation of Photosensitive Transfer Material

The procedure of Example 2 was repeated except that the undercoat layer was omitted. There was prepared a colored photosensitive sheet (photosensitive transfer sheet) for each of the four colors, each sheet comprising a barrier layer, a coloring material layer and a photosensitive layer arranged in order on a support to form a laminate.

COMPARISON EXAMPLE 4

Preparation of Photosensitive Transfer Material

The procedure of Example 3 was repeated except that the undercoat layer was omitted. There was prepared a colored photosensitive sheet (photosensitive transfer sheet) for each of the four colors, each sheet comprising a barrier layer, a coloring material layer and a photosensitive layer arranged in order on a support to form a laminate.

Evaluation of Photosensitive Transfer Sheet

The photosensitive sheet for each of the four colors and each of the corresponding color separation mask were used and exposure was carried out imagewise for 60 sec. using 1 kw ultrahigh pressure mercury vapor lamp P-607 Fw (manufactured by Dinippon Screen Mfg Co., Ltd.). Each of the exposed sheet was subjected to automatic develolpment at 31° C. for 34 seconds using a dilute solution (diluted five times) of a developer (Color Art Developer CA-1, trade name, manufactured by Fuji Photo Film Co., Ltd.) and a processor (Color Art Processor CA-600P, manufactured by Fuji Photo Film Co., Ltd.). Thus, there was obtained a color proofing sheet for each of the four colors, wherein color separation mask was reproduced at high fidelity.

Separately, a coating solution having the following composition was prepared. A biaxially oriented polyethylene terephthalate film of 100 μm thick was coated with the coating solution in such an amount as to give a coat layer having dry thickness of 20 μm, thus preparing an image receiving sheet.

| | |
|---|---|
| Methyl methacrylate polymer (average molecular weight: 100,000, produced by Wako Junyaku Co., Ltd.) | 90 g |
| Pentaerythritol tetraacrylate | 90 g |
| Michler's ketone | 0.51 g |
| Benzophenone | 3.18 g |
| p-Methoxyphenol | 0.09 g |
| Methyl ethyl ketone | 220 g |

The black color proofing sheet and the image receiving sheet were placed together in layers in such a manner that the image side contacted the face side of the image receiving sheet. They were laminated using Fuji Color Art transferring machine CA-600T (manufactured by Fuji Photo Film Co., Ltd.). The support on the side of the color proofing sheet was removed to transfer the black image to the image receiving sheet. In a similar manner to that described above, the color proofing sheets for the remaining three colors were subjected to registration to transfer each color image, thus obtaining an image receiving sheet having a four color halftone dot's image transferred thereto.

The image receiving sheet having the four color image transferred thereto was put upon art paper (final support), and they were laminated by using said transferring machine and wholly exposed from the side of the image receiving sheet for 120 seconds by using a daylight contact printer (P-607 Fw, manufactured by Dainippon Screen Mfg Co., Ltd., 1 kw ultrahigh pressure mercury vapor lamp used). The support of the image receiving sheet was removed to obtain the final image on art paper.

The results on the evaluation of the final image are shown in Table 1, wherein criteria are A: good, B: not good, and C: apparently bad.

TABLE 1

| Photosensitive sheet | Undercoat layer/ barrier layer | Fogging of non-image portion | Peeling of support |
|---|---|---|---|
| Example | | | |
| 1 | Yes/Yes | A | A |
| 2 | Yes/Yes | A | A |
| 3 | Yes/Yes | A | A |
| Comp. Ex. | | | |
| 1 | Yes/No | C | A |
| 2 | No/Yes | A | C |
| 3 | No/Yes | A | B |
| 4 | No/Yes | A | B |

Note: Fogging of non-image portion is evaluated on the final image. Peeling of support is evaluated on the workability of peeling of support of photosensitive sheet from image in transferring image from photosensitive sheet to image receiving sheet and evaluation on the state of image after peeling.

We claim:

1. A photosensitive material comprising:
   (I) an undercoat layer containing at least one alcohol-soluble polyamide;
   (II) an alcohol-insoluble barrier layer comprising an organic high-molecular material selected from the group consisting of polyacrylates, acrylate copolymers, polymethacrylates, and methacrylate copolymers;
   (III) a coloring material layer containing a pigment or dye in an alkali-soluble organic high molecular material which has been coated on the barrier layer, using a coating composition comprising the pigment or dye and the alkali-soluble organic high molecular material in a solvent containing an alcohol; and
   (IV) a photosensitive layer;
   superposed in order on a support to form a laminate.

2. The photosensitive material as claimed in claim 1, wherein said photosensitive layer contains a naphthoquinone diazide photosensitive material.

3. The photosensitive material as claimed in claim 1, wherein said undercoat layer contains at least 50% by weight of the alcohol-soluble polyamide.

4. The photosensitive material as claimed in claim 1, wherein said alcohol-soluble polyamide is a linear polyamide.

5. The photosensitive material as claimed in claim 1, wherein said barrier layer has a thickness in the range of 0.2 to 10 μm.

* * * * *

UNITED STATES PATENT AND TRADEMARK OFFICE
CERTIFICATE OF CORRECTION

PATENT NO. : 5,002,850
DATED : March 26, 1991
INVENTOR(S) : Fumiaki Shinozaki; Kazuo Suzuki; Tamotsu Suzuki; Tomizo Namiki; Tomohisa Tago; Mikio Totsuka It is certified that error appears in the above-identified patent and that said Letters Patent is hereby corrected as shown below:

Please amend section [54] to read as follows:

[54] PHOTOSENSITIVE MATERIAL WITH ALKALI-INSOLUBLE BARRIER LAYER

Signed and Sealed this

Twentieth Day of October, 1992

Attest:

DOUGLAS B. COMER

*Attesting Officer*  *Acting Commissioner of Patents and Trademarks*